United States Patent
Song et al.

(10) Patent No.: US 8,232,199 B2
(45) Date of Patent: Jul. 31, 2012

(54) METHOD OF FABRICATING SEMICONDUCTOR DEVICE COMPRISES A PHOTORESIST PATTERN HAVING A DESIRED CRITICAL DIMENSION

(75) Inventors: Won Song, Seoul (KR); Byung-Goo Jeon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 10 days.

(21) Appl. No.: 12/828,404

(22) Filed: Jul. 1, 2010

(65) Prior Publication Data
US 2012/0003761 A1    Jan. 5, 2012

(51) Int. Cl.
*H01L 21/4763* (2006.01)
(52) U.S. Cl. ........ 438/638; 438/949; 438/637; 438/981; 257/774
(58) Field of Classification Search .......... 257/774, 257/775, 758, 750, 751, 411; 438/637, 638, 438/639, 640, 668, 622, 623, 624, 625, 627, 438/942, 949, 494, 948, 981, 670, 951, 643
See application file for complete search history.

(56) References Cited

U.S. PATENT DOCUMENTS

| 5,363,171 | A  | * | 11/1994 | Mack ............................. | 355/68  |
| 7,265,382 | B2 |   | 9/2007  | Lymberopoulos et al. |         |
| 2004/0253815 | A1 | * | 12/2004 | Sun et al. ..................... | 438/670 |
| 2005/0032354 | A1 | * | 2/2005  | Chu et al. ..................... | 438/636 |
| 2008/0303169 | A1 | * | 12/2008 | Goller et al. ................. | 257/774 |

FOREIGN PATENT DOCUMENTS

| JP | 2007-234770 | 9/2007 |
| KR | 1020070069982 A | 7/2007 |

* cited by examiner

*Primary Examiner* — Ha Tran T Nguyen
*Assistant Examiner* — Thanh Y Tran
(74) *Attorney, Agent, or Firm* — Myers Bigel Sibley & Sajovec, PA

(57) ABSTRACT

A method of fabricating a semiconductor device and a fabrication system of the semiconductor device are provided. The method includes sequentially forming a film to be etched and a dielectric film and measuring a thickness of the dielectric film, forming a photoresist film on the dielectric film, performing a lithography process using the measured thickness of the dielectric film to form a photoresist film pattern, and etching the dielectric film and the film to be etched using the photoresist film pattern.

5 Claims, 6 Drawing Sheets

METHOD OF FABRICATING SEMICONDUCTOR DEVICE COMPRISES A PHOTORESIST PATTERN HAVING A DESIRED CRITICAL DIMENSION

BACKGROUND OF THE INVENTION

The present invention relates to a method of fabricating a semiconductor device and a fabrication system of the semiconductor device, and more specifically, to a method of fabricating a semiconductor device, in which critical dimension control of a to-be-etched film pattern can be achieved in a reliable manner, and a fabrication system of the semiconductor device.

Generally, a semiconductor fabricating process includes various processes, including deposition, lithography, etching, ion implantation, and so on. The lithography for forming a desired film pattern to be etched, which includes forming a photoresist film pattern and etching using the photoresist film pattern, is a key process in the semiconductor fabrication.

However, in the event of non-uniformity in the thickness of a dielectric film formed on the film to be etched, even if a photoresist pattern having a desired critical dimension is formed in a lithography process, a critical dimension of the to-be-etched film pattern formed in the subsequent etching process may not be efficiently controlled. For example, if a thickness of the dielectric film formed on the film to be etched is greater than a desired thickness, the critical dimension of the to-be-etched film pattern is reduced to be smaller than a desired critical dimension. On the contrary, if a thickness of the dielectric film formed is smaller than the desired thickness, the critical dimension of the to-be-etched film pattern is increased to be greater than the desired critical dimension.

SUMMARY OF THE INVENTION

The present invention provides a method of fabricating a semiconductor device having improved reliability.

The present invention also provides a fabrication system of a semiconductor device having improved reliability.

The above and other objects of the present invention will be described in or be apparent from the following description of the various embodiments.

According to an aspect of the present invention, a method of fabricating a semiconductor device and a fabrication system of the semiconductor device are provided. The method includes sequentially forming a film to be etched and a dielectric film and measuring a thickness of the dielectric film, forming a photoresist film on the dielectric film, performing a lithography process using the measured thickness of the dielectric film to form a photoresist film pattern, and etching the dielectric film and the film to be etched using the photoresist film pattern.

According to another aspect of the present invention, there is provided a method of fabricating a semiconductor device including sequentially forming a film to be etched and a dielectric film and measuring a thickness of the dielectric film, forming a photoresist film on the dielectric film, performing a lithography process using the measured thickness of the dielectric film to form a photoresist film pattern, and etching the dielectric film and the film to be etched using the photoresist film pattern, wherein when the dielectric film has a first thickness, the photoresist pattern has a first critical dimension, and when the dielectric film has a second thickness, the photoresist pattern has a second critical dimension.

According to still another aspect of the present invention, there is provided a fabrication system of a semiconductor device including a film forming system of forming a film to be etched, a dielectric film and a photoresist film on a substrate, a thickness metrology system of measuring thicknesses of the dielectric film, a lithography system of performing a lithography process using the photoresist film, a control system of controlling processing parameters of the lithography system using data on the measured thicknesses of the dielectric film, and an etching system of etching the dielectric film and the film to be etched using the photoresist film pattern.

DETAILED DESCRIPTION OF THE INVENTION

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In some embodiments, structures of devices and techniques which are well known in the art will not be discussed in detail herein so as not to unnecessarily obscure aspects of the present invention.

It will be understood that, although the terms first, second, etc. may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the present invention.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Spatially relative terms, e.g., "below," "beneath," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Figure 1:
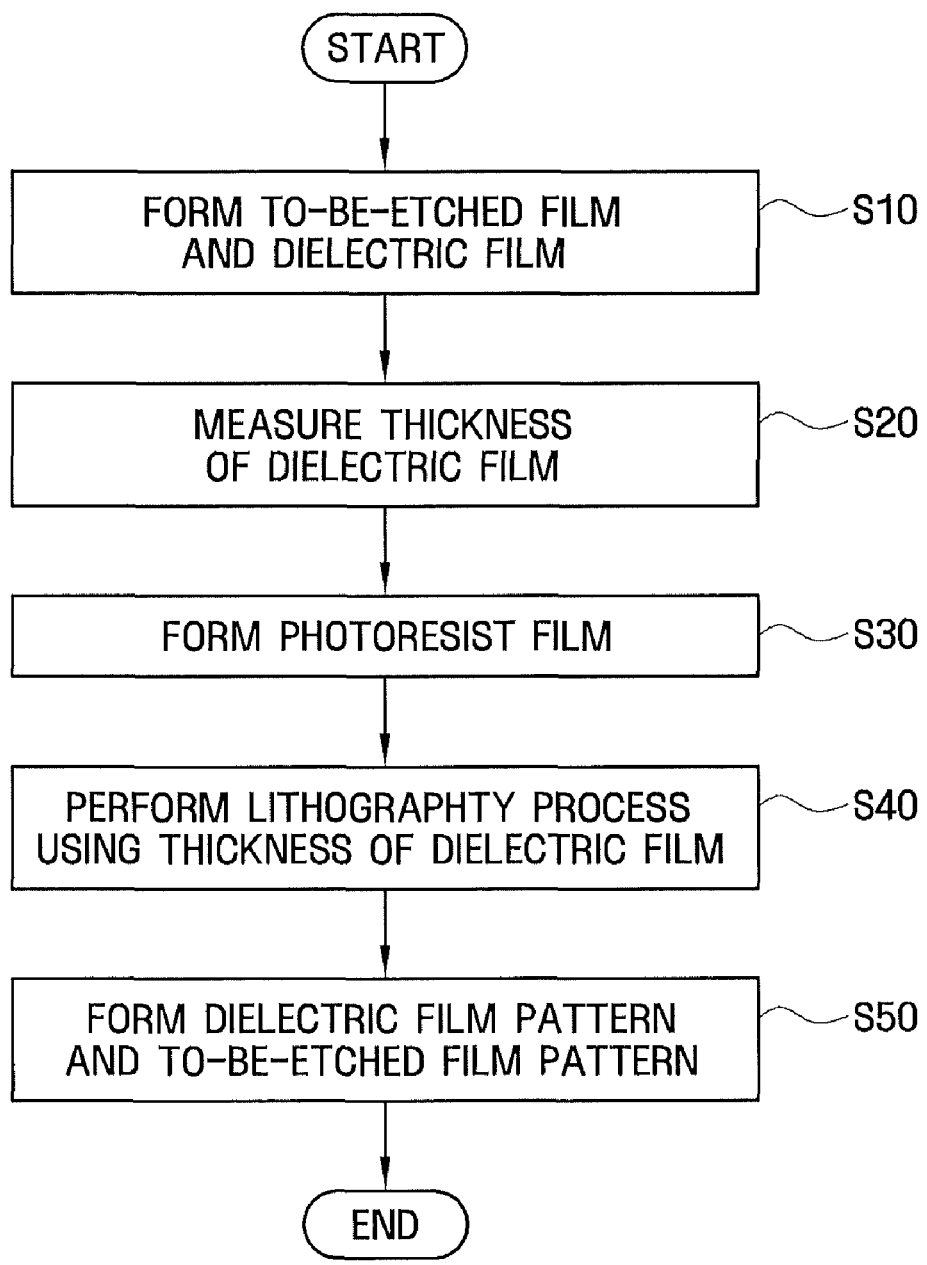
FIG. 1 is a flow diagram of a method of fabricating a semiconductor device according to an embodiment of the present invention.

FIG. 1 is a flow diagram of a method of fabricating a semiconductor device according to an embodiment of the present invention, and FIGS. 2 through 5 illustrate intermediate structures in the method of fabricating a semiconductor device according to an embodiment of the present invention.

Figure 2:
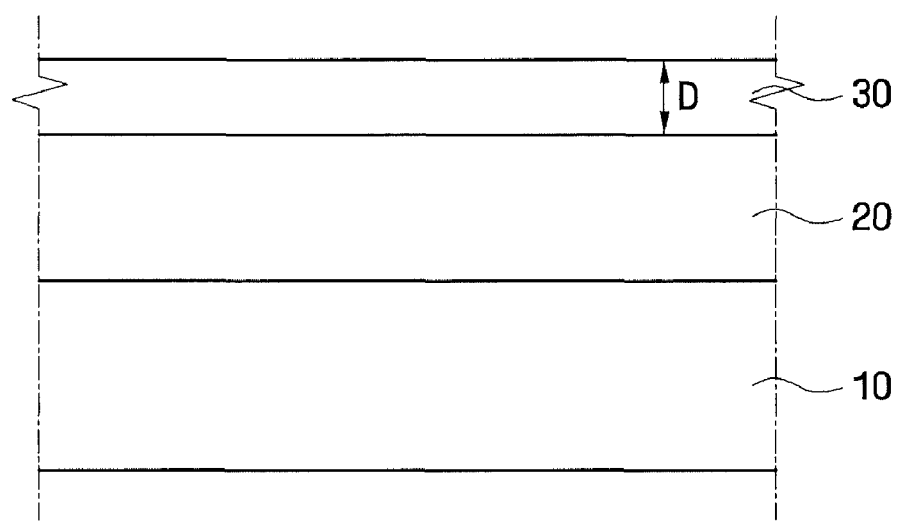
FIGS. 2 through 5 illustrate intermediate structures in the method of fabricating a semiconductor device according to an embodiment of the present invention.

Referring to FIGS. 1 and 2, a film 20 to be etched, which is referred to as a to-be-etched film hereinafter, and a dielectric film 30 are sequentially formed on a substrate 10 (S10).

The substrate 10 may be a Si substrate, a SOI (Silicon On Insulator) substrate, a GaAs substrate, a SiGe substrate, a ceramic substrate, a quartz substrate, or a glass substrate for display. Alternatively, the substrate 10 may, for example, be a P-type substrate. In addition, although not shown, the substrate 10 may be used in a form of a P-type epitaxial layer grown on the substrate 10.

Although not shown in the drawings, transistors, interlayer insulating films, contact holes, metal interconnections, and so on, may be formed on the substrate 10, the selection of which can be readily envisioned by a person of ordinary skill in the art, and the description thereabout will not be given.

The to-be-etched film 20 is a film that is to be etched in a predetermined pattern in a continuous etching process, and examples of the to-be-etched film 20 include an oxide film, a nitride film, a dielectric film, such as a low-k film or a high-k film, a conductive film, such as a polysilicon film, and so on. Meanwhile, although not shown, an etch stop layer having a high etch selectivity with respect to the to-be-etched film 20 may be formed under the to-be-etched film 20.

The dielectric film 30, which is formed on the to-be-etched film 20, may be used to prevent reflection of light in a lithography process or may be used as a mask layer in an etching process. The dielectric film 30 may be a single film or a multi-layered film having a high etching selectivity with respect to a photoresist film and capable of effectively preventing reflection of light in a lithography process. For example, when the to-be-etched film 20 is an anti-reflective coating (ARC), the dielectric film 30 may be an interlayer dielectric (ILD) film.

Next, a thickness D of the dielectric film 30 is measured using a thickness measuring device (S20). Here, the thickness D of the dielectric film 30 may be measured at a predetermined position, e.g., at least one position, of the substrate 10.

Figure 3:
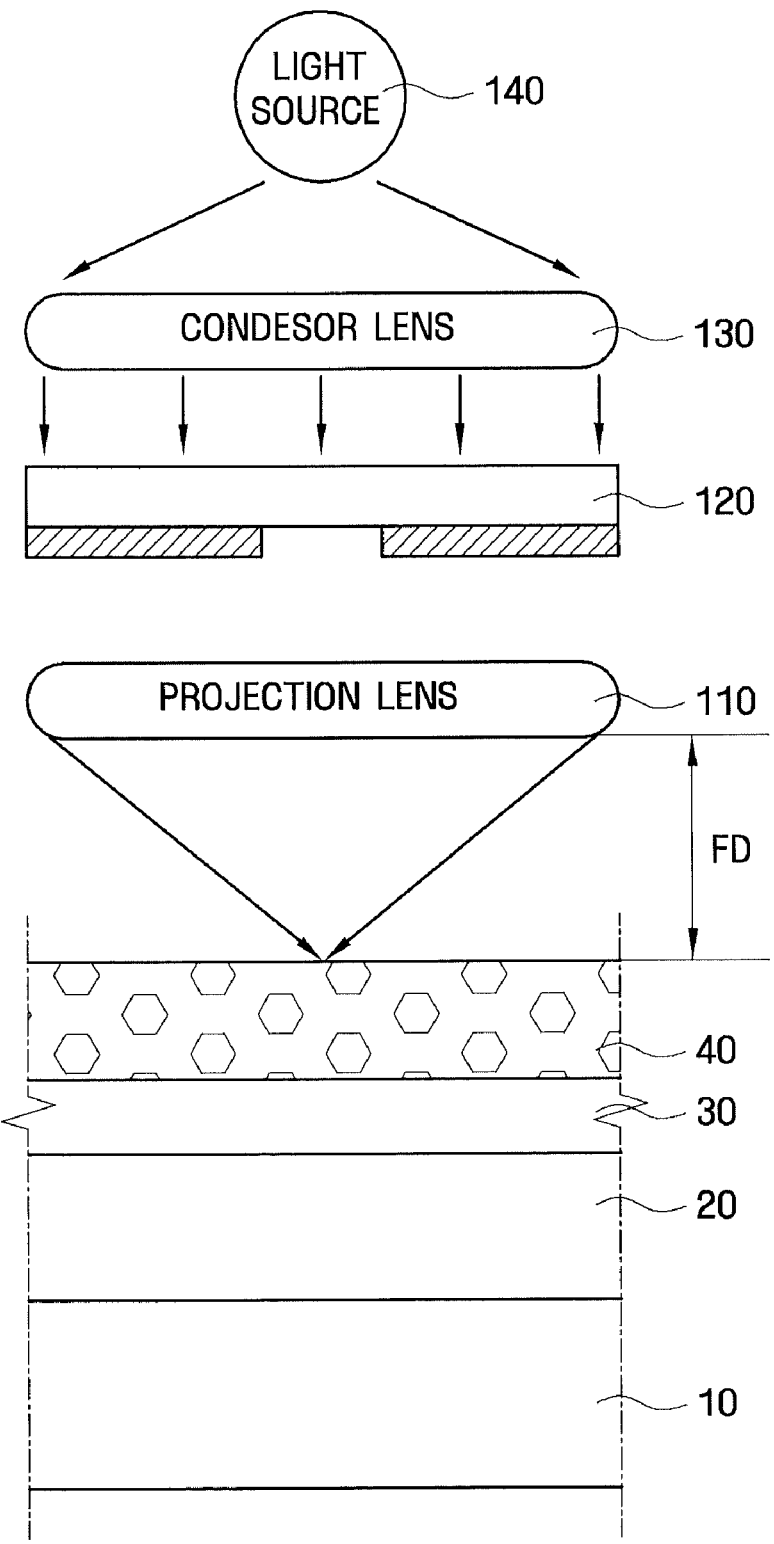
Figure 4:
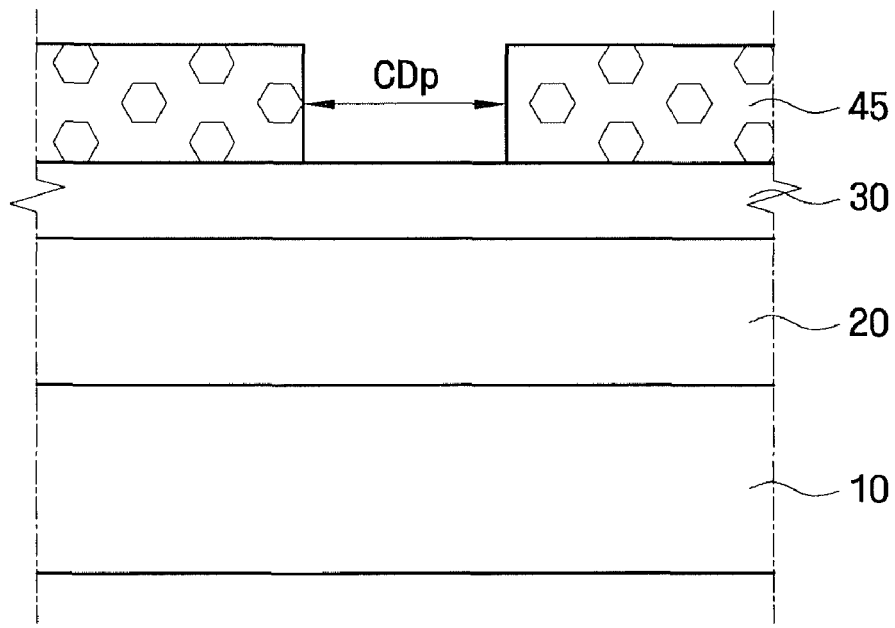

Referring to FIGS. 1, 3 and 4, a photoresist film 40 is formed on the dielectric film 30 (S30), and a photoresist film pattern 45 having a critical dimension (CD) CDp is formed using a lithography process (S40). Here, the CDp may be the smallest width of a line or the smallest distance between two lines specified by a design rule for a manufacturing process of a particular element. For convenience of explanation, the CDp is shown as the smallest width of a line specified by a design rule, but the CDp may not be limited thereto.

Particularly, in the method of fabricating the semiconductor device according to an exemplary embodiment of the present invention, the lithography process may be performed using the thickness D of the dielectric film 30 measured prior to the lithography process. In detail, the lithography process may be performed while varying processing parameters, such as a projecting focus depth FD, exposure energy and/or exposure time, using the thickness D of the dielectric film 30 measured prior to the lithography process.

For example, as shown in FIG. 3, in the lithography process including a light source 140, a condenser lens 130, a mask pattern 120, and a projection lens 110, the focus depth FD can be determined by the thickness D of the dielectric film 30. Here, the focus depth FD may correspond to positions on an optimum focal plane of an optical system with respect to a reference plane, for example, a top surface or center of the photoresist film 40, which are measured along an optical axis, that is, an axis perpendicular to the optimum focal plane.

When the thickness D of the dielectric film 30 becomes greater than a desired thickness, the focus depth FD may be reduced during a lithography projection process. On the other hand, when the thickness D of the dielectric film 30 becomes smaller than the desired thickness, the focus depth FD may be increased during the lithography projection process.

Accordingly, even if there is a change in the thickness of the dielectric film 30 due to a processing error, an error in the lithography process due to a focus deviation may be practically avoided, thereby enhancing the reliability of the lithography process. In other words, the critical dimension CDp of the photoresist film pattern 45 formed in the lithography process may be effectively controlled by a predetermined critical dimension CDp determined by a specified design rule, not by a lithography process error. Further, the critical dimension of the to-be-etched film pattern formed in the subsequent etching process may also be effectively controlled by a specific design rule.

Further, in the method of fabricating the semiconductor device according to an exemplary embodiment of the present invention, the exposure energy and/or exposure time may also be determined using the thickness of the dielectric film 30 measured prior to the lithography process. That is to say, the exposure energy and/or exposure time of the lithography process may be determined using the thickness of the dielectric film 30 measured prior to the lithography process, and the critical dimension CDp of the photoresist film pattern 45 may be determined. In detail, when the thickness D of the dielectric film 30 is greater than a desired thickness, the exposure energy and/or exposure time of the lithography process are increased, and the critical dimension CDp of the photoresist film pattern 45 may be increased. On the other hand, when the thickness D of the dielectric film 30 is smaller than the desired thickness, the exposure energy and/or exposure time of the lithography process may be reduced and the critical dimension CDp of the photoresist film pattern 45 may be decreased. Accordingly, even if there is a change in the thickness of the dielectric film 30 due to a processing error, the critical dimension of the to-be-etched film pattern can be effectively controlled in the subsequent etching process, thereby fabricating a semiconductor device having improved reliability, which will later be described in detail with reference to FIGS. 6 through 8.

Figure 5:
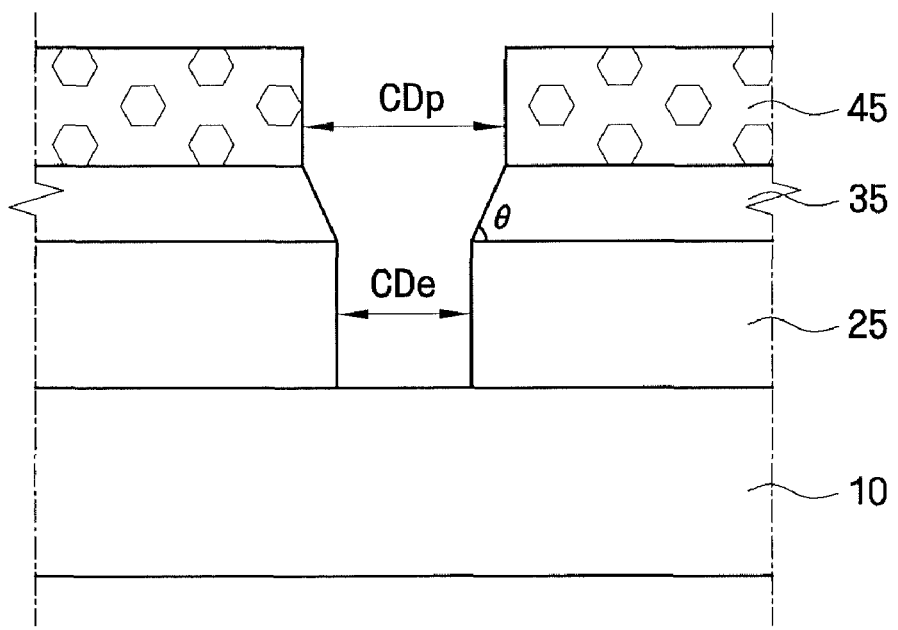

Referring to FIGS. 1 and 5, the dielectric film 30 and the to-be-etched film 20 are etched using the photoresist film pattern 45 to form a dielectric film pattern 35 and a to-be-etched film pattern 25 (S50). The dielectric film pattern 35 has an etching selectivity different from that of the dielectric film 30 or the to-be-etched film 20. Thus, the dielectric film pattern 35 may have a predetermined tilt angle θ, unlike the to-be-etched film pattern 25. Here, the predetermined tilt angle θ of the dielectric film pattern 35 may be an angle of inclination formed between a sidewall of the dielectric film pattern 35 and the bottom wall of the dielectric film pattern 35, and may be set to a predetermined value according to a material forming the dielectric film 30 and an etching material used in the etching process. In addition, the to-be-etched film pattern 25 resulting from the etching process of the to-be-etched film 20 may have a predetermined critical dimension CDe. Particularly, in the method of fabricating the semiconductor device according to an exemplary embodiment of the present invention, even if there is a change in the thickness of the dielectric film 30 (or the dielectric film pattern) due to a processing error, the to-be-etched film pattern 25 may have substantially the same critical dimension CDe, irrespective of the thickness of the dielectric film 30, which will later be described in detail with reference to FIGS. 6 through 8.

Figure 6:
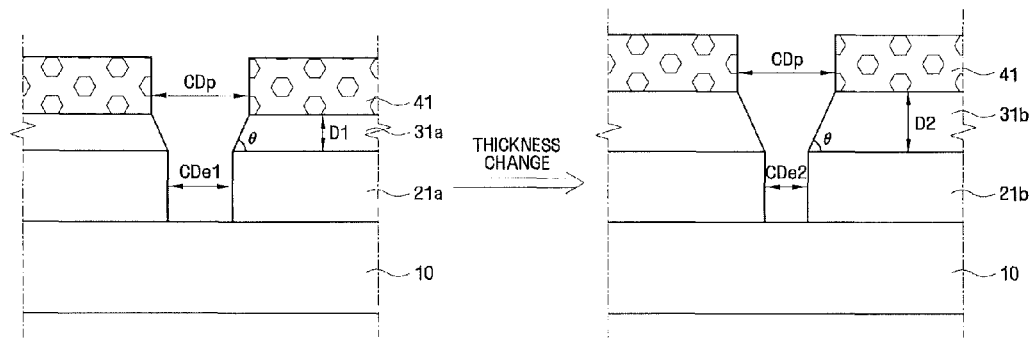
FIG. 6 illustrates a relationship between a thickness of a dielectric film and a critical dimension of a to-be-etched film pattern when the critical dimension of a photoresist film pattern is the same irrespective of the thickness of the dielectric film.
Figure 7:
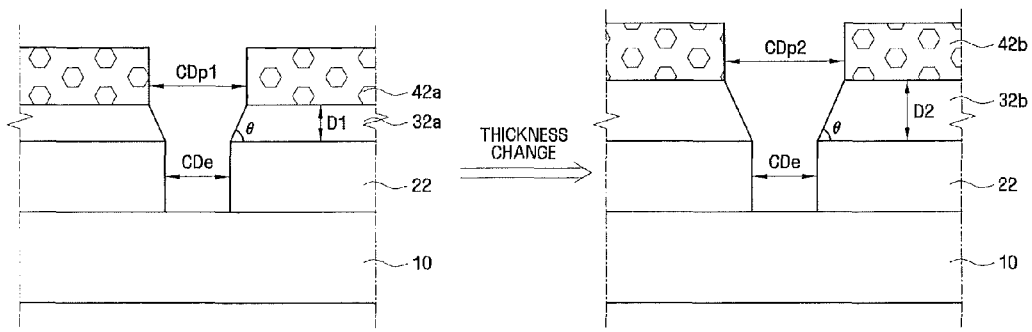
FIG. 7 illustrates a relationship between a thickness of a dielectric film and a critical dimension of a to-be-etched film pattern when the critical dimension of a photoresist film pattern changes according to the thickness of the dielectric film.
Figure 8:
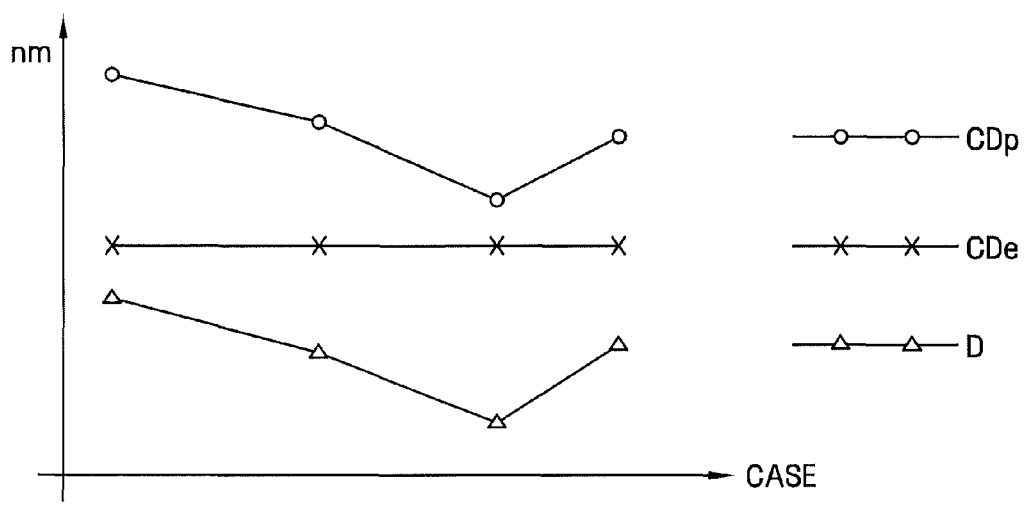
FIG. 8 illustrates a variation in the critical dimension of a photoresist film pattern according to the thickness of the dielectric film in the method of fabricating a semiconductor device according to an embodiment of the present invention.

FIG. 6 illustrates a relationship between a thickness of a dielectric film and a critical dimension of a to-be-etched film pattern when the critical dimension of a photoresist film pattern is the same irrespective of the thickness of the dielectric film, FIG. 7 illustrates a relationship between a thickness of a dielectric film and a critical dimension of a to-be-etched film pattern when the critical dimension of a photoresist film pattern varies the same according to the thickness of the dielectric film, and FIG. 8 illustrates a variation in the critical dimension of a photoresist film pattern according to the thickness of the dielectric film in the method of fabricating a semiconductor device according to an embodiment of the present invention.

Referring to FIG. 6, when the to-be-etched film and the dielectric film that are sequentially formed, are etched using a photoresist film pattern 41 having substantially the same critical dimension CDp irrespective of the thickness of the dielectric film (or the thickness of a dielectric film pattern), first and second critical dimensions CDe1 and CDe2 of first and second to-be-etched film patterns 21a and 21b may vary according to first and second thicknesses D1 and D2 of the dielectric film and tilt angles θ of first and second dielectric film patterns 31a and 31b. When the dielectric film has the first thickness D1, the first to-be-etched film pattern 21a may have the first critical dimension CDe1. When the dielectric film has the second thickness D2, the second to-be-etched film pattern 21b may have the second critical dimension CDe2.

For example, when the dielectric film having the first thickness D1 and the to-be-etched film are etched using the photoresist film pattern 41 having the critical dimension CDp, the to-be-etched film pattern 21a may have the first critical dimension CDe1, which is about "arctan θ×D1" smaller than the critical dimension CDp of the photoresist film pattern 41. In contrast, when the dielectric film having the second thickness D2 and the to-be-etched film are etched using the photoresist film pattern 41 having the critical dimension CDp, the to-be-etched film pattern 21b may have the second critical dimension CDe2, which is about "arctan θ×D2" smaller than the critical dimension CDp of the photoresist film pattern 41. In other words, the photoresist film pattern 41 is formed using the photoresist film pattern 41 having the same critical dimension CDp irrespective of the thickness of the dielectric film.

Accordingly, when the thickness of the dielectric film is greater than a desired thickness due to a processing error, a critical dimension (e.g., CDe2) of a to-be-etched film pattern (e.g., 21b) may become smaller than the desired critical dimension (e.g., CDe1). On the other hand, when the thickness of the dielectric film is smaller than the desired thickness due to a processing error, a critical dimension of a to-be-etched film pattern may become greater than the desired critical dimension.

However, in the method of fabricating the semiconductor device according to an exemplary embodiment of the present invention, as shown in FIG. 7, first and second critical dimensions CDp1 and CDp2 of first and second photoresist film patterns 42a and 42b may be determined by the thickness of the dielectric film. Accordingly, the foregoing problems may be substantially addressed. In detail, when a first dielectric film 32a has a first thickness D1, a first photoresist film pattern 42a having a first critical dimension CDp1 may be formed by adjusting processing parameters, such as exposure energy and/or exposure time, in a lithography process, and an etching process may be performed using the first photoresist film pattern 42a. On the other hand, when a second dielectric film 32b has a second thickness D2, a second photoresist film pattern 42b having a second critical dimension CDp2 may be formed by adjusting processing parameters, such as exposure energy and/or exposure time, in a lithography process, and an etching process may be performed using the second photoresist film pattern 42b. Here, a difference between the first and second critical dimensions CDp1 and CDp2 of the first and second photoresist film patterns 42a and 42b may be determined by a difference between the first and second thicknesses D1 and D2 of the first and second dielectric films 32a and 32b and arctan values of each tilt angle θ of the first and second dielectric films 32a and 32b.

While the processing parameters of the lithography process, such as a projecting focus depth, exposure energy and/or exposure time, etc., described in the illustrated embodiment, are determined according to the thickness of the dielectric film measured prior to the lithography process, the present invention is not limited by the illustrated processing parameters. In another exemplary embodiment, only the exposure energy and/or exposure time may be determined according to the thickness D of the dielectric film 30 measured prior to the lithography process.

Figure 9:
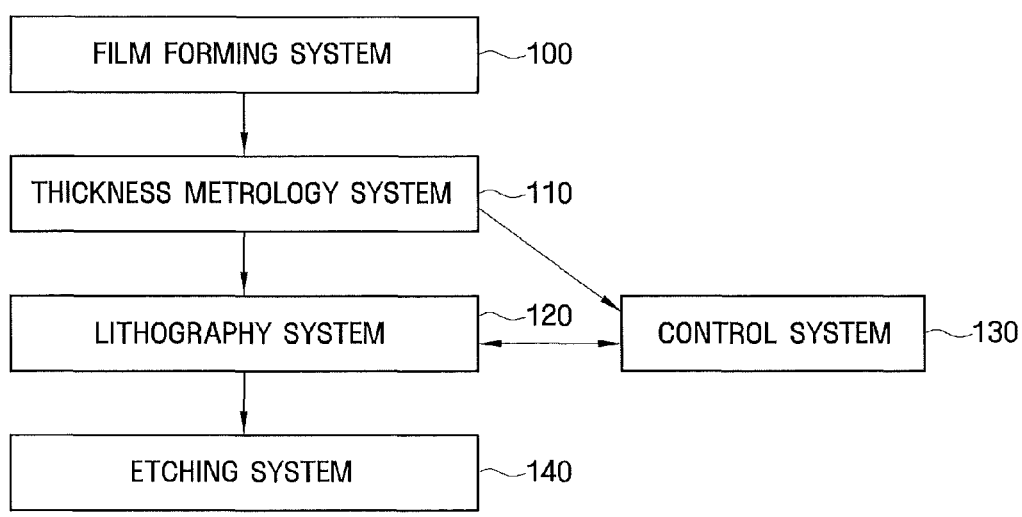
FIG. 9 illustrates a fabrication system of a semiconductor device according to another embodiment of the present invention.

FIG. 9 illustrates a fabrication system of a semiconductor device according to another embodiment of the present invention.

Referring to FIG. 9, the fabrication system of a semiconductor device according to another embodiment of the present invention includes a film formation system 100, a thickness metrology system 110, a lithography system 120, a control system 130 and an etching system 140.

The film formation system 100 includes devices for forming a film to be etched, a dielectric film, a photoresist film, etc. on a substrate. For example, the film formation system 100 may include a deposition device for depositing a film on the substrate, using PVD (Physical Vapor Deposition), CVD (Chemical Vapor Deposition), ALD (Atomic Layer Deposition), or the like. The film formation system 100 may also include a coating device for forming a coating of, for example, silicon, an organic material, or photoresist, on the substrate. However, the present invention is not limited to the illustrated devices, and the film formation system 100 may include various devices for forming various kinds of films on the substrate.

The thickness metrology system 110 includes a thickness measuring device for measuring thicknesses of the dielectric film formed on the substrate. In an exemplary embodiment, the thickness metrology system 110 may include an optical imaging device for measuring thicknesses of a dielectric film. The thicknesses of the dielectric film can be measured at a predetermined position on the substrate. The thickness metrology system 110 may be formed as an independent system, or may be incorporated into the film formation system 100 or the lithography system 120.

The lithography system 120 includes an exposure device for exposing a substrate having a photoresist film formed using a photoresist film pattern through a mask pattern, and a development device for developing the exposed substrate. For example, the exposure device may include any one of known reduction projection exposure devices (e.g., a stepper). Here, the mask pattern may be projected onto the photoresist film in a reduced size. In particular, the processing parameters of the lithography system 120, such as a projecting focus depth FD, exposure energy and/or exposure time, etc., may be controlled by the control system 130. Following the exposure, the exposed substrate may be transferred to the development device. Here, the exposed substrate may be subjected to a post exposure bake process, or a chemical process for removing an exposed (or unexposed) region of the photoresist film.

The illustrated systems and methods may be realized in hardware, software, firmware, a particular processor, or various combinations thereof. In the illustrated example, the foregoing embodiments may be implemented by one or more program storage devices and may be performed in software that is an application executable by a predetermined device or instrument including an appropriate architecture. Since various steps of the illustrated system modules and methods may be performed desirably in software, the relationship between system components (or flows of processing steps) may vary according to the way in which the application is programmed.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating a semiconductor device comprising:
   sequentially forming a film to be etched and a dielectric film and measuring a thickness D of the dielectric film;
   forming a photoresist film on the dielectric film;
   performing a lithography process using the measured thickness D of the dielectric film to form a photoresist film pattern by adjusting exposure energy, exposure time, and/or focal depth in the lithography process based on the measured thickness D of the dielectric film;
   wherein a critical dimension of the photoresist film pattern increases as the thickness of the dielectric film becomes increased; and
   etching the dielectric film and the film to be etched using the photoresist film pattern.

2. The method of claim 1, wherein the dielectric film is an anti-reflective film.

3. The method of claim 1, wherein the photoresist film is formed after measuring the thickness of the dielectric film.

4. A method of method of fabricating a semiconductor device comprising:
   sequentially forming a film to be etched and a dielectric film and measuring a thickness D of the dielectric film;
   forming a photoresist film on the dielectric film;
   performing a lithography process using the measured thickness D of the dielectric film to form a photoresist film pattern by adjusting exposure energy, exposure time, and/or focal depth in the lithography process based on the measured thickness D of the dielectric film;
   etching the dielectric film and the film to be etched using the photoresist film pattern, wherein when the dielectric film has a first thickness, the photoresist pattern has a first critical dimension, and when the dielectric film has a second thickness, the photoresist pattern has a second critical dimension; and
   wherein the second critical dimension of the photoresist pattern increases as the thickness of the dielectric film becomes increased.

5. The method of claim 4, wherein a lateral surface of the dielectric film pattern is tilted at a predetermined tilt angle with respect to a bottom surface of the dielectric film pattern, and a difference between the first and second critical dimensions of the photoresist film pattern is determined by a difference between the first and second thicknesses of the dielectric film and an arctan value of the tilt angle.

* * * * *